United States Patent
Kataoka et al.

(10) Patent No.: US 7,303,788 B2
(45) Date of Patent: Dec. 4, 2007

(54) METHOD FOR MANUFACTURING SOLAR CELL MODULE HAVING A SEALING RESIN LAYER FORMED ON A METAL OXIDE LAYER

(75) Inventors: Ichiro Kataoka, Nara (JP); Akiharu Takabayashi, Nara (JP); Hidenori Shiotsuka, Kanagawa (JP)

(73) Assignee: Canon Kabushiki Kaisha, Tokyo (JP)

( * ) Notice: Subject to any disclaimer, the term of this patent is extended or adjusted under 35 U.S.C. 154(b) by 861 days.

(21) Appl. No.: 10/801,704

(22) Filed: Mar. 17, 2004

(65) Prior Publication Data

US 2004/0191422 A1    Sep. 30, 2004

(30) Foreign Application Priority Data

Mar. 24, 2003 (JP) .............................. 2003-079464

(51) Int. Cl.
| | |
|---|---|
| B05D 5/04 | (2006.01) |
| B05D 5/12 | (2006.01) |
| B05D 3/06 | (2006.01) |
| B05D 3/02 | (2006.01) |
| B05D 7/24 | (2006.01) |
| B05D 1/38 | (2006.01) |
| B29C 47/00 | (2006.01) |

(52) U.S. Cl. .................. 427/553; 427/126.3; 427/74; 427/385.5; 427/419.5; 156/272.2; 156/244.17

(58) Field of Classification Search .................. None
See application file for complete search history.

(56) References Cited

U.S. PATENT DOCUMENTS

| | | | | |
|---|---|---|---|---|
| 4,663,829 | A | * | 5/1987 | Hartman et al. ............... 438/62 |
| 5,149,351 | A | * | 9/1992 | Yaba et al. ................... 65/60.2 |
| 5,344,501 | A | * | 9/1994 | Hashimoto et al. ......... 136/259 |
| 5,354,385 | A | * | 10/1994 | Hashimoto et al. ......... 136/259 |

(Continued)

FOREIGN PATENT DOCUMENTS

EP        000475441 A2 *    9/1991

(Continued)

OTHER PUBLICATIONS

"Testing methods for Peel Strength of Adhesives", JIS K 6854-1977, pp. 162-165 (with English-language translation), no month.

*Primary Examiner*—Marianne Padgett
(74) *Attorney, Agent, or Firm*—Fitzpatrick, Cella, Harper & Scinto

(57) ABSTRACT

The present invention provides a method for manufacturing a solar cell module having photovoltaic elements in each of which a metal oxide layer made of a metal oxide forms an outermost surface part thereof at a light incident side, and a sealing resin layer formed on the metal oxide layer. The method includes the steps of providing water on a surface of the metal oxide layer, the water being chemically adsorbed thereto; irradiating the metal oxide layer with electromagnetic waves for a predetermined time so that the contact angle of the water on the surface of the metal oxide layer is 60° or less, the electromagnetic waves having energy larger than the band gap of the metal oxide; and subsequently forming the sealing resin layer on the metal oxide layer.

8 Claims, 3 Drawing Sheets

U.S. PATENT DOCUMENTS

| | | | |
|---|---|---|---|
| 5,530,264 A * | 6/1996 | Kataoka et al. | 257/40 |
| 5,578,141 A | 11/1996 | Mori et al. | 136/251 |
| 5,582,653 A * | 12/1996 | Kataoka et al. | 136/251 |
| 5,656,098 A * | 8/1997 | Ishikawa et al. | 136/256 |
| 5,660,646 A | 8/1997 | Kataoka et al. | 136/251 |
| 5,684,325 A | 11/1997 | Kataoka et al. | 257/433 |
| 5,718,772 A | 2/1998 | Mori et al. | 136/251 |
| 5,725,909 A * | 3/1998 | Shaw et al. | 427/412.1 |
| 5,728,431 A * | 3/1998 | Bergbreiter et al. | 427/388.1 |
| 5,800,631 A | 9/1998 | Yamada et al. | 136/251 |
| 5,919,328 A * | 7/1999 | Tropsha et al. | 427/569 |
| 5,939,194 A * | 8/1999 | Hashimoto et al. | 428/411.1 |
| 5,973,258 A | 10/1999 | Shiotsuka et al. | 136/252 |
| 6,034,323 A | 3/2000 | Yamada et al. | 136/259 |
| 6,075,202 A | 6/2000 | Mori et al. | 136/251 |
| 6,113,718 A | 9/2000 | Yamada et al. | 156/78 |
| 6,133,522 A | 10/2000 | Kataoka et al. | 136/259 |
| 6,162,986 A | 12/2000 | Shiotsuka et al. | 136/244 |
| 6,175,075 B1 | 1/2001 | Shiotsuka et al. | 136/251 |
| 6,182,403 B1 | 2/2001 | Mimura et al. | 52/173.3 |
| 6,183,923 B1 * | 2/2001 | Kato et al. | 430/96 |
| 6,191,062 B1 * | 2/2001 | Hayakawa et al. | 502/159 |
| 6,214,422 B1 * | 4/2001 | Yializis | 428/488 |
| 6,218,609 B1 | 4/2001 | Mori et al. | 136/259 |
| 6,245,987 B1 | 6/2001 | Shiomi et al. | 136/244 |
| 6,291,761 B1 | 9/2001 | Takada et al. | 136/244 |
| 6,307,145 B1 | 10/2001 | Kataoka et al. | 136/251 |
| 6,320,115 B1 | 11/2001 | Kataoka et al. | 136/251 |
| 6,414,236 B1 | 7/2002 | Kataoka et al. | 136/251 |
| 6,515,216 B2 | 2/2003 | Zenko et al. | 136/244 |
| 6,534,702 B1 | 3/2003 | Makita et al. | 136/244 |
| 6,546,535 B1 | 4/2003 | Nagao et al. | 716/11 |
| 6,613,973 B2 | 9/2003 | Mukai et al. | 136/255 |
| 6,653,549 B2 | 11/2003 | Matsushita et al. | 136/244 |
| 6,664,597 B2 | 12/2003 | Takeyama et al. | 257/347 |
| 6,676,459 B2 | 1/2004 | Mukai et al. | 439/884 |
| 6,679,978 B2 * | 1/2004 | Johnson et al. | 204/192.22 |
| 6,693,237 B2 | 2/2004 | Zenko et al. | 136/244 |
| 6,703,555 B2 | 3/2004 | Takabayashi et al. | 136/244 |
| 6,793,980 B2 * | 9/2004 | Ohtsu et al. | 427/558 |
| 2001/0054435 A1 | 12/2001 | Nagao et al. | 136/251 |
| 2002/0195138 A1 | 12/2002 | Itoyama et al. | 136/251 |
| 2003/0000566 A1 | 1/2003 | Matsushita et al. | 136/244 |
| 2003/0005955 A1 | 1/2003 | Shiotsuka et al. | 136/251 |
| 2003/0010373 A1 | 1/2003 | Tsuzuki et al. | 136/244 |
| 2003/0017371 A1 * | 1/2003 | Burrows et al. | 428/697 |
| 2003/0075211 A1 | 4/2003 | Makita et al. | 136/244 |
| 2003/0143437 A1 * | 7/2003 | Ohtsu et al. | 428/701 |
| 2003/0234038 A1 | 12/2003 | Kurokami et al. | 136/255 |
| 2004/0045595 A1 | 3/2004 | Makita et al. | 136/244 |
| 2005/0095356 A1 * | 5/2005 | Nakamura et al. | 427/58 |
| 2007/0128416 A1 * | 6/2007 | Takahashi et al. | 428/195.1 |

FOREIGN PATENT DOCUMENTS

| | | | |
|---|---|---|---|
| JP | 2-170473 | | 7/1990 |
| JP | 7-38126 | | 2/1995 |
| JP | 2000-168254 A | * | 6/2000 |
| JP | 2001-180145 | * | 7/2001 |

* cited by examiner

METHOD FOR MANUFACTURING SOLAR CELL MODULE HAVING A SEALING RESIN LAYER FORMED ON A METAL OXIDE LAYER

BACKGROUND OF THE INVENTION

1. Field of the Invention

The present invention relates to methods for manufacturing a solar cell module, and more particularly, relates to a method for manufacturing a solar cell module which comprises at least one photovoltaic element in which a transparent conductive layer forms an outermost surface part thereof at a light incident side, and a sealing resin layer formed on the transparent conductive layer.

2. Description of the Related Art

Various types of solar cells (photovoltaic elements), such as crystal silicon solar cells, polycrystal silicon solar cells, amorphous silicon solar cells, copper indium selenide solar cells, and compound semiconductor solar cells, have already been used. Among those mentioned above, since thin-film crystal silicon solar cells, compound semiconductor solar cells, and amorphous silicon solar cells can be manufactured at a relatively low cost and may be designed to have a larger surface area, research and development therefor have been aggressively performed.

In addition, among the solar cells mentioned above, since a thin film solar cell represented by an amorphous silicon solar cell, which is composed of a conductive metal substrate, silicon deposited thereon, and a transparent conductive layer made of a transparent conductive metal oxide thin film formed on the silicon, is lightweight and has superior impact resistance and flexibility, the thin film solar cell has been regarded as one of the prospective candidates used for forming a future solar cell module. However, in a manner different from that in the case in which silicon is deposited on a glass substrate, a transparent sealing material must be provided to cover a surface of a photovoltaic element at a light incident side for protection thereof. Accordingly, as a surface sealing material in contact with a photovoltaic element, for example, various thermoplastic and thermosetting transparent organic polymers, fluorinated resins, or hard coating materials capable of forming an inorganic film have been proposed. Some of the reasons for using the materials mentioned above are as follows. First, thermoplastic and thermosetting resins are inexpensive and can be formed into a sealing material having a large thickness sufficient for protecting a photovoltaic element at a low cost; second, since fluorinated resins have superior weather resistance, degradation caused by outdoor exposure for a long period of time is very small, and hence degradation in performance of a photovoltaic element can be minimized; and third, since hard coating materials are formed into an inorganic film, a very hard coating film having superior weather resistance and humidity resistance can be realized.

In addition, on a photovoltaic element, collector electrodes are formed from a conductive paste composed of a binder polymer and a conductive fine powder dispersed therein, so that current can be efficiently collected.

In a general solar cell module, a photovoltaic element group is formed from a plurality of photovoltaic elements, and collector electrodes are provided on each photovoltaic element. In addition, by a thermoplastic transparent organic resin, the photovoltaic element group is sealed, and in addition, a thin fluorinated polymer layer and an insulating layer are bonded to each other. In this example, the same organic resin as that provided at a light incident surface side is also used at a rear surface side. More particularly, the thin fluorinated polymer layer is made of a fluorinated resin film such as an ethylene-tetrafluoroethylene copolymer (ETFE) film or a poly(vinyl fluoride) film (PVF); the thermoplastic transparent organic resin is an ethylene-vinyl acetate copolymer (EVA), a butyral resin, or the like; the collector electrode is formed from a conductive paste using a conventionally known resin as a binder polymer; and for the insulating layer, various organic resin films, such as a nylon film and an aluminum laminated teddler film, may be used. In this example, the thermoplastic transparent organic resin is used as an adhesive between the photovoltaic element, the fluorinated resin film, and the insulating layer and is also used as a filling material for protecting the solar cell module from damage such as scratching and/or impact done thereto from the outside.

However, in the structure of the conventional surface coating material, an interface formed of an inorganic material and an organic material is present between the photovoltaic element made of an inorganic layer and the transparent organic polymer resin, which forms an organic layer, and hence, due to the difference in properties therebetween, such as a coefficient of thermal expansion, a glass transition temperature, hydrophilic and hydrophobic properties, and water absorption, the adhesion between the layers has not been satisfactory.

Accordingly, when photovoltaic elements covered with a coating layer are used outside for a long period of time as a solar cell module, due to the insufficient adhesion between the photovoltaic elements and the transparent organic polymer resin and a thermal stress caused by severe changes in temperature and humidity, the photovoltaic element and the transparent organic polymer resin will be peeled away from each other, thereby causing a serious problem in view of the quality of the solar cell module.

In addition, even when a hard coating material capable of forming an inorganic coating film is applied, a coating film composed of only inorganic materials cannot be formed, and hence the adhesion to a photovoltaic element is still insufficient. Accordingly, when a hard coating film having a high hardness is formed from a hard coating material, by even a small difference in coefficient of thermal expansion between the hard coating film and a photovoltaic element, cracking and/or peeling may be liable to occur under high temperature conditions in some cases.

In order to solve the problems described above, a so-called integral blend method has been performed in which various coupling agents made, for example, of silane compounds and/or organic titanate compounds are added to a surface sealing material which is in direct contact with a photovoltaic element. However, by the method described above, for example, the following problems have occurred. That is, (1) since the content of a coupling agent becomes large such as one percent by weight or more, the properties of a surface sealing material resin are changed, and hence the durability thereof may be decreased in some cases; (2) when contained in a paint for coating, a coupling agent will compete with a leveling agent added thereto beforehand, and as a result, it may not be sufficiently supplied to the interface in some cases; (3) when added to a thermoplastic or a thermosetting resin in advance, a coupling agent is decomposed in heating for hot molding or heat curing; and (4) when a sealing material resin containing a coupling agent is held for a long period of time, gelation thereof advances as a reaction between the coupling agent and the resin gradually proceeds, and hence coating must be performed as quick as possible after the coupling agent is added to the sealing material resin.

In addition, Japanese Unexamined Patent Application Publication No. 7-38126 has disclosed that the adhesion between a sealing material and a surface of a photovoltaic element is improved by forming a monomolecular layer made of a silane coupling agent thereon. However, since the bonding between the photovoltaic element and the silane coupling agent is gradually hydrolyzed with moisture present in the air, the effect described above is limited in outdoor exposure performed for a long period of time.

On the other hand, in order to efficiently collect current generated in the semiconductor active layer, collector electrodes which collectively form a comb shape are provided in many cases on a photovoltaic element by using a conductive paste containing an organic polymer as a binder polymer. However, by the conventional method described above for forming collector electrodes, due to insufficient adhesion between the photovoltaic element and the binder polymer, difference in coefficient of thermal expansion therebetween, and the like, peeling is liable to occur between the photovoltaic element and the collector electrode. In addition, this occurrence of peeling increases contact resistance between the photovoltaic element and the collector electrode and is partly responsible for degradation in performance of the photovoltaic element. This problem described above is particularly serious when the photovoltaic elements are used outside for a long period of time as a solar cell module, and the contact resistance is liable to be increased by the change in temperature; hence, it has been difficult to guarantee the performance, such as conversion efficiency, of a solar cell module for a long period of time.

Accordingly, in order to improve the adhesion between a conductive paste and a photovoltaic element and to suppress the increase in contact resistance between a photovoltaic element and collector electrodes, as is the case with the use of the surface sealing material, addition of coupling agents to a conductive paste has been performed. For example, in order to improve the stability of an ohmic contact with time, Japanese Unexamined Patent Application Publication No. 2-170473 proposes to use a silane coupling agent at an interface between a thick electrode made of a conductive paste and a silicon film at a light transmitting surface side, the silicon film being a constituent element of an amorphous silicon solar cell formed on a light transparent substrate.

However, the use of coupling agents has several problems as is the case with the surface sealing material described above.

SUMMARY OF THE INVENTION

In consideration of the situation described above, the present invention was made, and a first object of the present invention is to provide a method for manufacturing a solar cell module, which improves the adhesion between a transparent conductive layer forming an outermost surface part of a photovoltaic element at a light incident side and a sealing material which is in direct contact with the transparent conductive layer. By the manufacturing method described above, occurrence of peeling between the sealing material and the transparent conductive layer can be minimized even when the solar cell module is used outside under severe conditions for a long period of time.

A second object of the present invention is to provide a method for manufacturing a solar cell module capable of exhibiting stable performance even when it is used outside for a long period of time. For this object, photovoltaic elements are used each having the structure in which at least one collector electrode is formed on a transparent conductive layer, the adhesion between the collector electrode and the transparent conductive layer is improved, and the increase in contact resistance therebetween, which is primarily caused by the change in temperature, is suppressed.

To these ends, the present invention provides a method for manufacturing a solar cell module which comprises at least one photovoltaic element in which a metal oxide layer made of a metal oxide forms an outermost surface part thereof located at a light incident side, and a sealing resin layer formed on the metal oxide layer.

The method described above comprises a step of providing water on a surface of the metal oxide layer, the water being chemically adsorbed thereto; a step of irradiating the metal oxide layer with electromagnetic waves for a predetermined period of time so that the contact angle of the water on the surface of the metal oxide layer is 60° or less, the electromagnetic waves having energy larger than the band gap of the metal oxide; and a sealing step of subsequently forming the sealing resin layer on the metal oxide layer.

The method for forming a solar cell module, described above, may further comprise a step of washing the surface of the metal oxide layer with water before the sealing step is performed.

In addition, the method for forming a solar cell module, described above, may further comprise a step of performing heat treatment for a predetermined time in a vacuum atmosphere before the sealing step is performed.

Further objects, features and advantages of the present invention will become apparent from the following description of the preferred embodiments with reference to the attached drawings.

DESCRIPTION OF THE PREFERRED EMBODIMENTS

Hereinafter, the embodiments of the present invention will be described with reference to the attached drawings; however, the present invention is not limited to the embodiments.

Figure 1A:
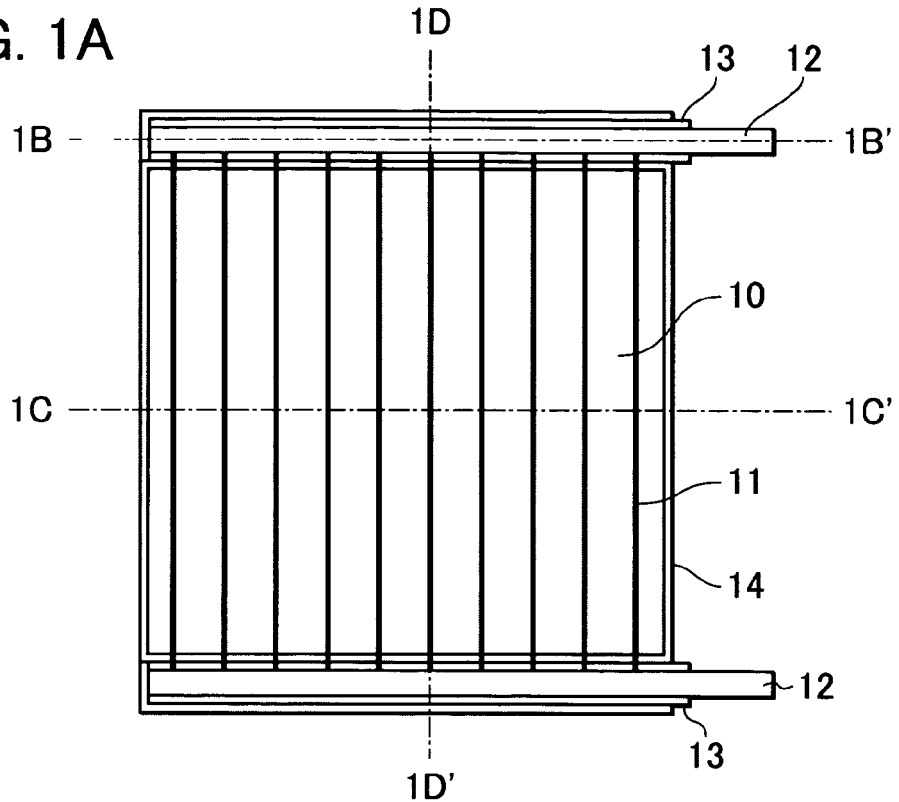
FIGS. 1A, 1B, 1C and 1D are schematic views of a photovoltaic element used in one embodiment of a manufacturing method of a solar cell module, according to the present invention.
Figure 1B:
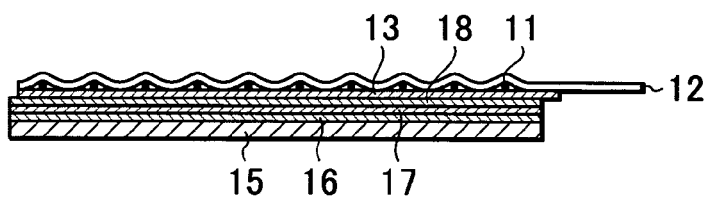
Figure 1C:
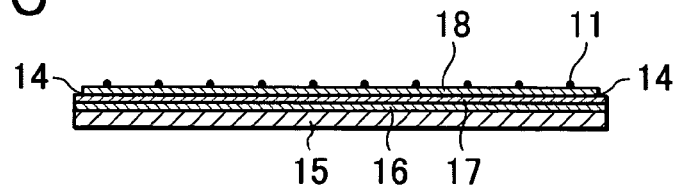
Figure 1D:
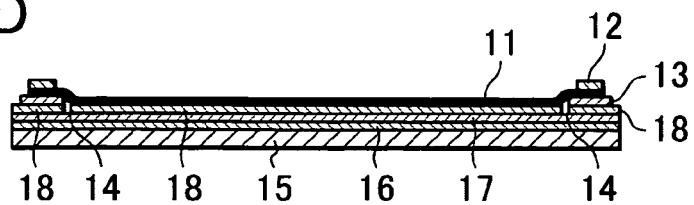

FIG. 1A is of a schematic plan view of a photovoltaic element used in one embodiment of a manufacturing method of a solar cell module, according to the present invention. FIGS. 1B, 1C, and 1D are schematic cross-sectional views of the photovoltaic element taken along the lines 1B-1B', 1C-1C', and 1D-1D', respectively. In the photovoltaic element shown in FIGS. 1A to 1D, reference numeral 15 indicates a conductive substrate, reference numeral 16 indicates a rear reflection layer, reference numeral 17 indicates a semiconductor active layer, reference numeral 18 indicates a transparent conductive layer, reference numeral 11 indicates a collector electrode, reference numeral 12 indicates a busbar electrode, and reference numeral 13 is an insulating material.

A method for manufacturing a solar cell module, according to the present invention, is a method for forming a solar cell which comprises photovoltaic elements in each of which a transparent conductive layer made of a metal oxide forms an outermost surface part of the photovoltaic element at a light incident side, and a sealing resin layer formed on the metal oxide layers. More particularly, the method described above comprises a step of providing water on a surface of the transparent conductive layer, the water being chemically adsorbed thereto; a step of irradiating the transparent conductive layer with electromagnetic waves for a predetermined time so that the contact angle of the water on the surface of the transparent conductive layer is 60° or less, the electromagnetic waves having energy larger than the band gap of the metal oxide; and a sealing step of then forming the sealing resin layer on the transparent conductive layer. When the contact angle of the water on the surface of the transparent conductive layer is set to 60° or less, although a silane coupling agent is not used, a sufficient effect of improving the adhesion with the sealing resin layer can be obtained.

Figure 4:
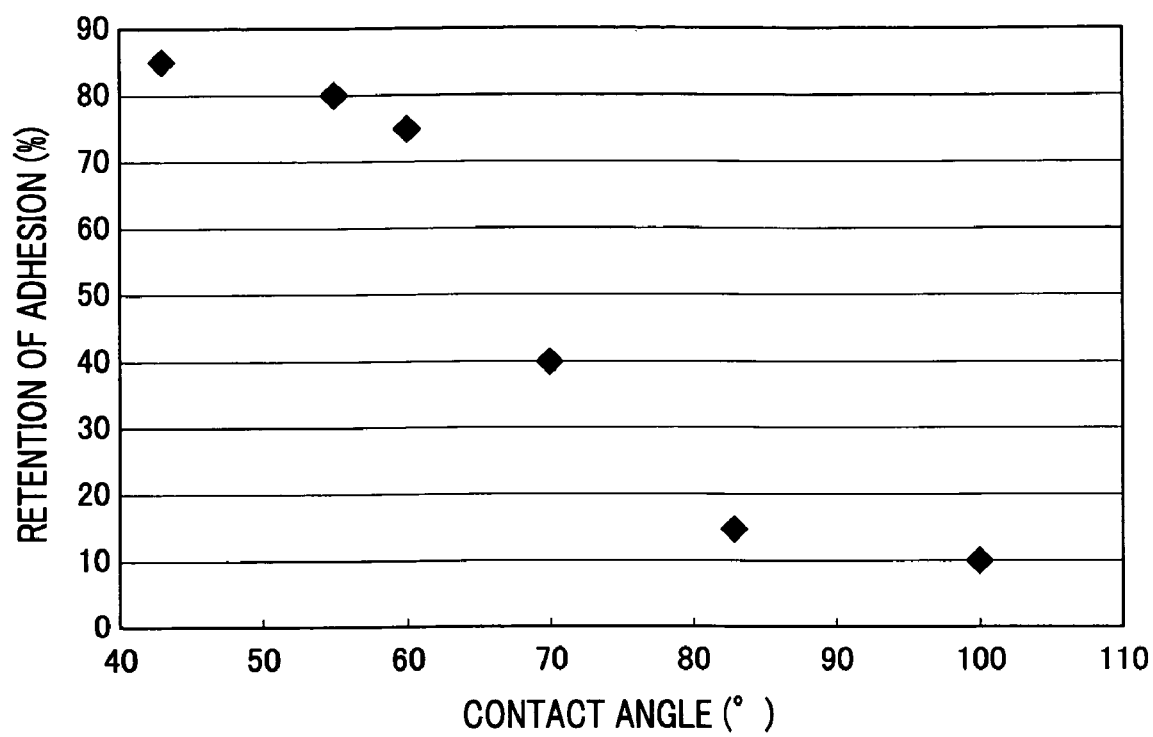
FIG. 4 is a graph showing the relationship between the retention of adhesion obtained after a high temperature and high humidity test and the contact angle of water on a surface of a transparent conductive layer.

FIG. 4 is a graph showing the relationship between the contact angle of water on the surface of the transparent conductive layer and the retention of adhesion measured after a high temperature and high humidity test. The retention of adhesion mentioned above is a value on a percent basis obtained by dividing the adhesion measured after the test by the adhesion (regarded as 100%) measured before the test, and the test is performed for 1,000 hours at a temperature of 85° C. and at a humidity of 85% RH. This test will be described later in detail. The photovoltaic element used in this embodiment has $In_2O_3$—$SnO_2$ (ITO) as the transparent conductive layer forming an outermost surface part located at a light incident side. The transparent conductive layer is irradiated with UV rays having a wavelength of 350 nm or less using a metal halide lamp at an intensity of 50 mW/cm$^2$ while the time for irradiation is changed, the wavelength having an energy larger than the band gap of $SnO_2$, so that the contact angle of water on the surface of the transparent conductive layer is changed. In addition, an ethylene-vinyl acetate copolymer is used as a sealing resin for forming the sealing resin layer and is bonded onto the transparent conductive layer by thermo-compression bonding. As can be seen from FIG. 4, the adhesion is preferably retained when the contact angle of water is 60° or less. On the other hand, when the contact angle is larger than 60°, the adhesion cannot be retained, and hence the decrease in adhesion starts to be observed.

A method for radiating electromagnetic waves may be variously selected from conventional known methods; however, a method using a discharge tube lamp is simple and preferable. In general, the band gap of the metal oxide constituting the transparent conductive layer is approximately 3 eV or more, and hence the wavelength of electromagnetic waves to be radiated is 400 nm or less. As a discharge tube lamp, which efficiently generates electromagnetic waves having a wavelength as described above, for example, a xenon lamp, a metal halide lamp, or a mercury lamp may be mentioned. The radiation intensity of electromagnetic waves is not particularly specified; however, an intensity of from 10 to 1,000 mW/cm$^2$ is preferable at the irradiated surface since the contact angle of water can be efficiently set to 60° or less in a short period of time.

Before the sealing step is performed, when a step of washing the transparent conductive layer is performed with water, the adhesion can be further improved. That is, since the density of chemically adsorbed water onto the surface of the transparent conductive layer is increased, the density of an OH group generated thereon by irradiation with electromagnetic waves can be increased. Hence, it is believed that the adhesion with a sealing resin having reactivity with an OH group or with a sealing resin having affinity thereto can be increased.

In addition, when the sealing resin layer is formed after heat treatment is performed for a predetermined time in a vacuum atmosphere, the adhesion can also be improved. The reason for this is believed that when heat treatment is performed in a vacuum atmosphere, elimination of physically adsorbed water on the surface of the transparent conductive layer is facilitated, and the density of an OH group on the surface thereof is increased.

Next, the structure of a photovoltaic element will be described which is preferably used for the method for manufacturing a solar cell module, according to the present invention.

(Conductive Substrate)

The conductive substrate 15 is used as a base plate of the photovoltaic element and is also used as a lower electrode. However, when the semiconductor active layer itself has a superior mechanical strength and electrical conductivity, the conductive base plate may not be provided. As materials for forming the conductive substrate 15, for example, there may be mentioned silicon (Si), tantalum (Ta), molybdenum (Mo), tungsten (W), stainless steel, aluminum (Al), copper (Cu), titanium (Ti), carbon sheets, lead plated steel sheets, and resin films or ceramics each provided with a conductive layer.

(Rear Reflection Layer)

As the rear reflection layer 16, a metal layer, a metal oxide layer, or a metal layer and a metal oxide layer may be formed on the conductive substrate 15 described above. For the metal layer, for example, Ti, chromium (Cr), Mo, W, Al, silver (Ag), and nickel (Ni) may be used, and for the metal oxide layer, for example, ZnO, $TiO_2$, or $SnO_2$ may be used. As methods for forming the metal layer and the metal oxide layer described above, a resistance heating deposition method, an electron beam deposition method, and a sputtering method may be mentioned.

(Semiconductor Active Layer)

The semiconductor active layer 17 is a layer for performing photoelectric conversion, and as a particular material therefor, for example, there may be mentioned a pn junction type polycrystal silicon, a pin junction type amorphous silicon, or a compound semiconductor such as $CuInSe_2$, $CuInS_2$, GaAs, $CdS/Cd_2S$, CdS/CdTe, CdS/InP, or CdTe/$Cu_2Te$. As methods for forming the semiconductor active layer 17 described above, for example, there may be mentioned formation of a sheet from molten silicon or heat treatment of amorphous silicon in the case of the polycrystal silicon; plasma CVD using silane gases or the like as a starting material in the case of the amorphous silicon; and ion plating, ion beam deposition, vacuum deposition, sputtering, electrodeposition, or the like in the case of the compound semiconductor.

(Transparent Conductive Layer)

The transparent conductive layer 18 is used as an electrode of the photovoltaic element at a light incident side. As a material used for the transparent conductive layer 18, for example, $In_2O_3$, $SnO_2$, $In_2O_3$—$SnO_2$ (ITO), ZnO, $TiO_2$, $Cd_2SnO_4$, or a highly doped crystal semiconductor layer may be mentioned. Among those mentioned above, in particular, $SnO_2$, $In_2O_3$—$SnO_2$ (ITO), ZnO, and $TiO_2$ are preferable since the adhesion is significantly increased by irradiation with electromagnetic waves. As methods for forming the transparent conductive layer 18, a resistance heating deposition, a sputtering, a spray, a CVD, and an impurity diffusion method may be mentioned by way of example.

(Collector Electrode)

The collector electrodes 11 which form a comb shape are provided on the transparent conductive layer 18 in order to efficiently collect current. As a particular material for the collector electrode 11, for example, Ti, Cr, Mo, W, Al, Ag, Ni, Cu, tin (Sn), or a conductive paste such as a silver paste may be mentioned. As methods for forming the collector electrodes 11, for example, there may be mentioned a sputtering method, a resistance heating method, or a CVD method, using a mask pattern; a method in which a metal film is deposited over the entire surface, followed by removal of unnecessary parts by etching for patterning; a method for directly forming a grid electrode pattern by photo-induced CVD; a method for performing plating after a negative pattern mask for a grid electrode pattern is formed; a method for printing a conductive paste; and a method for performing thermo-compression bonding of metal wires each coated with a conductive paste. As the conductive paste, in general, a paste composed of powdered silver, gold, copper, nickel, carbon, or the like dispersed in a binder polymer is used. As the binder polymer described above, for example, a polyester, an epoxy, an acrylic, an alkid, a poly(vinyl acetate), a rubber, a urethane, or a phenolic resin may be mentioned.

(Busbar Electrode)

In order to obtain an output power, the busbar electrodes 12 are electrically connected to the collector electrodes 11 with a conductive adhesive or solder for collecting current therefrom.

The photovoltaic elements formed by the method described above are connected to each other in series or in parallel in accordance with a desired voltage or current. Alternatively, the photovoltaic elements may be integrated on an insulated substrate so as to obtain a desired voltage or current.

Next, with reference to FIG. 2, a method for forming a solar cell module by coating the photovoltaic elements will be described.

Figure 2:
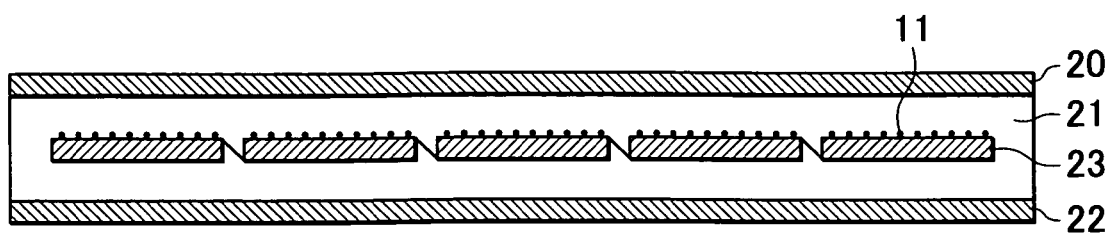
FIG. 2 is a schematic cross-sectional view showing an example of a solar cell module.

In the solar cell module shown in FIG. 2, reference numeral 20 indicates a front surface member, reference numeral 21 indicates a transparent organic polymer resin layer made of a transparent organic polymer resin, reference numeral 23 indicates a photovoltaic element group containing a plurality of photovoltaic elements, and reference numeral 22 indicates a rear surface member.

The rear surface member 22 is provided at the rear side of the photovoltaic element group 23 with the transparent organic polymer resin provided therebetween, which is also used as an adhesive. The front surface member 20, which is transparent, is adhered onto the transparent conductive layers 18 located at the light incident side with the transparent organic polymer resin interposed therebetween.

(Front Surface Member)

The front surface member 20 is required to have toughness as well as superior weather resistance and transparency. For example, as materials suitably used for aforementioned applications, there may be mentioned glass; various fluorinated resin films composed, for example, of an ethylene-tetrafluoroethylene copolymer (ETFE), a chlorotrifluoro ethylene resin (PCTFE), a tetrafluoroethylene-perfluoroalkyl vinyl ether copolymer (PFA), a tetrafluoroethylene-hexafluoropropylene copolymer (FEP), a vinyliden fluoride resin (PVDF), and a vinyl fluoride resin (PVF); polycarbonate films; and acrylic films.

(Transparent Organic Polymer Resin Layer)

The transparent organic polymer resin layer 21 bonds the front surface member 20 and the rear surface member 22 to the photovoltaic element group 23 and also serves as a sealing material protecting the photovoltaic element group 23 from damage such as scratching and/or impact done thereto from the outside. As materials for the transparent organic polymer resin layer 21, for example, there may be mentioned adhesives which are primarily composed of transparent resins such as an ethylene-vinyl acetate copolymer (EVA), an ethylene-methyl acrylate copolymer (EMA), an ethylene-ethyl acrylate copolymer (EEA), an ethylene-methyl methacrylate copolymer (EMMA), an ethylene-acrylic acid copolymer (EAA), an ethylene-methacrylic acid copolymer (EMAA), a poly(vinyl butyral) resin (PVB), a silicone resin, an epoxy resin, a fluorinated polyimide resin, a vinylidene fluoride resin, and an acrylic resin. A cross-linking agent or a thermal-oxidation inhibitor, which improves heat resistance, and/or a ultraviolet absorber or a photo-oxidation inhibitor, which suppresses photo-induced degradation, is preferably added to the resins mentioned above. In particular, by adding a ultraviolet absorber, the change in surface condition of the transparent conductive layer, which is caused by ultraviolet rays incident thereon after the formation of the sealing resin layer, can be suppressed, and as a result, the adhesion can be stably improved.

(Rear Surface Member)

As the rear surface member 22, for example, various insulating resins, ceramics, glasses, metal substrates covered with insulating coating, aluminum laminated teddler films, glass reinforced plastics (FRP) may be used.

A method for forming a solar cell module is generally performed by lamination. That is, by using adhesive sheets which are formed from the transparent organic polymer resin by molding, a laminate composed of the rear surface member, the adhesive sheet, the photovoltaic element group, the adhesive sheet, and the front surface member formed in that order is then heated for a predetermined time while a pressure is being applied thereto, thereby forming a laminated module. Alternatively, by coating of the photovoltaic element group with a liquid sealing resin, a solar cell module may also be formed.

That is, according to the present invention, in the manufacturing method of a solar cell module which comprises photovoltaic elements in each of which a metal oxide layer forms an outermost surface part of the photovoltaic element at a light incident side, and a sealing resin layer on the metal oxide layers, water is provided on the surfaces of the metal oxide layers, the water being chemically adsorbed thereto, the metal oxide layers are irradiated with electromagnetic waves having energy larger than the band gap of the metal oxide for a predetermined time so that the contact angle of water on the surfaces of the metal oxide layers is 60° or less, and subsequently the sealing resin layer is formed thereon in a sealing step, thereby improving the adhesion between the sealing resin layer and the metal oxide layers. As a result, a highly reliable solar cell module can be provided in which the sealing resin layer is unlikely to be peeled away from the metal oxide layers even when the solar cell module is used outside under severe conditions for a long period of time.

Furthermore, in a photovoltaic element comprising collector electrodes, when the collector electrodes are formed on the metal oxide layer, which is provided with water having a contact angle of 60° or less on the surface thereof, by using a conductive paste containing an organic polymer resin as a binder polymer, the adhesion between the metal oxide layer and the collector electrodes is improved. Hence, even when a solar cell module formed of the photovoltaic element described above is used outside under severe conditions in which a great change in temperature occurs, increase in contact resistance and occurrence of peeling between the metal oxide layer and the collector electrodes can be suppressed, and as a result, a solar cell module exhibiting stable properties for a long period of time can be provided.

In addition, when a step of washing the surfaces of the metal oxide layers with water is performed prior to the sealing step, or when the sealing resin layer is formed after heat treatment is performed for a predetermined time in a vacuum atmosphere, the adhesion between the sealing resin layer and the metal oxide layers can be further improved.

While the above preferred embodiments of the present invention have been described, such descriptions are for illustrative purposes only, and it is to be understood that whenever necessary, the structure, the materials, and the like may be variously changed without departing from the spirit and the scope of the present invention.

EXAMPLES

Hereinafter, the examples of the present invention will be described in detail with reference to the drawings; however, the present invention is not limited to the examples.

Example 1

First, an amorphous silicon (a-Si) solar cell (photovoltaic element) was formed. Referring to FIGS. 1A to 1D, the procedure of formation thereof will be described.

On the conductive substrate 15 made of a stainless steel substrate processed by washing, an Al layer (500 nm thick) and a ZnO layer (500 nm thick) were formed in that order by sputtering as the rear reflection layer 16. Next, by a plasma CVD method, an n-type a-Si layer, an i-type a-Si layer, and a p-type microcrystal μc-Si layer were formed using a mixture of $SiH_4$, $PH_3$, and $H_2$, a mixture of $SiH_4$ and $H_2$, and a mixture of $SiH_4$, $BF_3$, and $H_2$, respectively, thereby forming a tandem type a-Si semiconductor active layer 17 composed of an n-type layer 15 nm thick, an i-type layer 400 nm thick, a p-type layer 10 nm thick, an n-type layer 10 nm thick, an i-type layer 80 nm thick, and a p-type layer 10 nm thick. Next, as the transparent conductive layer 18, indium (In) and Sn were deposited by a reactive sputtering method in an oxygen atmosphere, thereby forming an $In_2O_3$-$SnO_2$ (ITO) thin film (70 nm thick).

Next, after fine particles of an acrylic resin and glycerin were added to iron(III) chloride hexahydrate which was melted beforehand by heating and then kneaded together to form a paste, the paste thus formed was applied along the peripheral portion of the transparent conductive layer 18 by screen printing so as to have a width of 1 mm. After heating was performed at 150° C. for 10 minutes, followed by washing with purified water and drying, patterning of the peripheral portion of the transparent conductive layer 18 was performed, and hence a portion 14 was obtained by removing a part of the transparent conductive layer.

Next, the transparent conductive layer 18 was irradiated with UV rays using a metal halide lamp. The radiation intensity of UV rays having a wavelength of 350 nm or less was 100 mW/cm$^2$ on the transparent conductive layer 18, and the radiation time was 10 minutes. As a result, the contact angle of water on the surface of the transparent conductive layer 18 was decreased from 110° to 43°.

Subsequently, thin wires 0.1 mm in diameter coated with a carbon paste were formed on the transparent conductive layer 18 by thermo-compression bonding, thereby forming the collector electrodes 11.

Next, at the peripheral portions of the element, silver plated copper foils (busbar electrodes) 12 having a thickness of 0.1 mm and a width of 5 mm were placed so as to overlap the end portions of the collector electrodes 11 and were bonded thereto by compression bonding with a carbon paste used as an adhesive. In addition, between the element and each busbar electrode 12, a double-sided tape made of a polyester resin was provided as the insulating material 13 in order to fix the busbar electrode 12 and to electrically insulate between the busbar electrode 12 and the surface of the element. In addition, the busbar electrode 12 was formed so that one end thereof extended outside the element.

Figure 3:
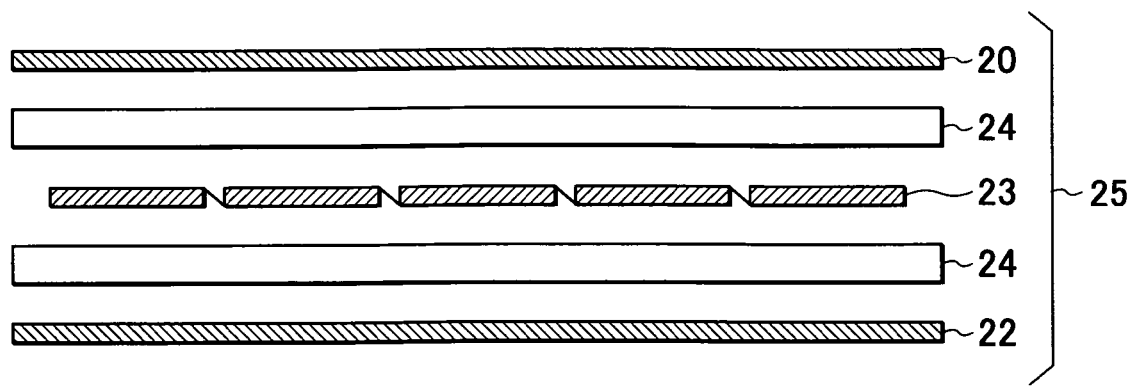
FIG. 3 is a schematic cross-sectional view showing a solar cell module laminate according to example 1.

The photovoltaic element group 23 which is composed of photovoltaic elements connected in series to obtain a desired output was provided so as to form the laminate structure shown in FIG. 3 before the contact angle of water on the surface of the transparent conductive layer 18 exceeded 60°. In general, a contact angle decreased by irradiation with electromagnetic waves is retained for approximately one week after the irradiation; however, irradiation with electromagnetic waves may be performed again before the laminate structure is formed. An aluminum laminated teddler film was used as the rear surface member 22, a molded EVA 24 sheet provided with a cross-linking agent, a UV absorber, and an oxidation inhibitor in advance was used as the transparent organic polymer resin, and an ETFE film was used as the front surface member 20, the ETFE film having a surface processed by corona discharge which is to be in contact with the resin.

After the photovoltaic element group 23 was heated to 120° C. for 10 minutes at a reduced pressure of 6.7×10$^2$ Pa (5 torr), the ETFE film, the EVA sheet, the photovoltaic element group, the EVA sheet, and the aluminum laminated teddler film were laminated to each other in that order from the top for forming a solar cell module laminate 25 and were then processed by thermo-compression bonding at 150° C. for 30 minutes, thereby forming a solar cell module.

Example 2

As the transparent conductive layer, the ITO thin film was formed in example 1; however, in example 2, a ZnO thin film (100 nm thick) was formed by sputtering. In addition, instead of a metal halide lamp, UV radiation was performed using a ultra-high pressure mercury lamp. In this step, the radiation intensity of UV rays having a wavelength of 400 nm or less was 50 mW/cm$^2$ on the transparent conductive layer, and the radiation time was 20 minutes. By this step, the contact angle of water on the surface of the transparent conductive layer was decreased from 80° to 55°. Except for the above-described conditions, a solar cell module was formed in the same manner as that described in example 1.

Example 3

The EVA sheets were used in example 1; however, in example 3, EEA (ethylene-ethyl acrylate copolymer) sheets were used to sandwich the photovoltaic element group. Except for the condition described above, a solar cell module was formed in the same manner as that described in example 1.

Example 4

In example 4, one percent by weight of a silane coupling agent was added to the EVA sheet. Except for the condition described above, a solar cell module was formed in the same manner as that described in example 1.

Comparative Example 1

In comparative example 1, except that UV radiation was not performed, a solar cell module was formed in the same manner as that described in example 1.

Comparative Example 2

In comparative example 2, except that UV radiation was not performed, a solar cell module was formed in the same manner as that described in example 2.

Comparative Example 3

In comparative example 3, except that UV radiation was not performed, a solar cell module was formed in the same manner as that described in example 3.

Comparative Example 4

In comparative example 4, except that UV radiation was not performed, a solar cell module was formed in the same manner as that described in example 4.

Comparative Example 5

In comparative example 5, the UV radiation time was decreased, and the contact angle of water on the surface of the transparent conductive layer was set to 70°. Except for the conditions described above, a solar cell module was formed in the same manner as that described in example 1.

For the solar cell modules formed in accordance with the manufacturing methods described in examples 1 to 4 and comparative examples 1 to 5, the following evaluations were conducted.

(1) High Temperature and High Humidity Test After the solar cell module thus formed was placed at a temperature of 85° C. and at a humidity of 85% RH for 1,000 hours, the adhesion between the transparent conductive layer and the sealing resin layer was measured by the 180° peel test method (JIS K6854). In this measurement, the peeling rate was set to 50 mm/min. The adhesion was also measured before the high temperature and high humidity test was performed, and the retention of adhesion was a value on a percent basis obtained by dividing the adhesion measured after the test by the adhesion (regarded as 100%) measured before the test. Furthermore, the adhesion between the collector electrode and the transparent conductive layer was measured by peeling away one collector electrode from the transparent conductive layer in a direction perpendicular thereto, and the retention of adhesion was calculated from a value obtained by averaging the adhesions of 10 samples which were subjected to the test. In addition, the change in appearance after the test was also observed. The results of the observation are shown in Table 1 in which a sample which was not changed is represented by ◯, and in which when a sample was changed, the change in appearance thereof is concisely described.

(2) Weather Resistance Test

The solar cell module thus formed was irradiated with an energy of 180 mW/cm$^2$ using light having a wavelength of 300 to 400 nm, which light was emitted from a solar simulator provided with a xenon lamp. Simultaneously, the temperature in the atmosphere was controlled to have a black panel temperature of 83° C., and the humidity was also set to 70% RH. In addition, for 18 minutes in every two hours, water was sprayed onto the module surface. These conditions were continuously held for 5,000 hours, and the appearance of the module was observed after the test was completed. The results of the observation are shown in Table 1 in which a sample which was not changed is represented by ◯, and in which when a sample was changed, the change in appearance thereof is concisely described. In addition, the adhesion between the transparent conductive layer and the sealing resin layer was measured in accordance with the peel test method described above, and the retention of adhesion was calculated from the average value obtained from 10 samples.

Table 1 shows the results obtained by the evaluations described above which were performed for the solar cell modules of examples 1 to 4 and comparative examples 1 to 5.

TABLE 1

|  | High Temperature and High Humidity Test | | | Weather Resistance Test | |
| --- | --- | --- | --- | --- | --- |
|  | Retention of Adhesion between a transparent conductive layer and a sealing resin layer (%) | Retention of Adhesion between a transparent conductive layer and a collector electrode (%) | Change in Appearance | Retention of Adhesion between a transparent conductive layer and a sealing resin layer (%) | Change in Appearance |
| Example 1 | 85 | 83 | ◯ | 35 | ◯ |
| Example 2 | 78 | 74 | ◯ | 20 | ◯ |
| Example 3 | 81 | 86 | ◯ | 22 | ◯ |
| Example 4 | 73 | 75 | ◯ | 38 | ◯ |

TABLE 1-continued

| | High Temperature and High Humidity Test | | | Weather Resistance Test | |
|---|---|---|---|---|---|
| | Retention of Adhesion between a transparent conductive layer and a sealing resin layer (%) | Retention of Adhesion between a transparent conductive layer and a collector electrode (%) | Change in Appearance | Retention of Adhesion between a transparent conductive layer and a sealing resin layer (%) | Change in Appearance |
| Comparative Example 1 | 10 | 45 | ○ | 6 | Local small Peeling at the interface between a transparent conductive layer and a sealing resin layer |
| Comparative Example 2 | 7 | 30 | Local small Peeling at the interface between a transparent conductive layer and a sealing resin layer | 5 | Local small Peeling at the interface between a transparent conductive layer and a sealing resin layer |
| Comparative Example 3 | 5 | 52 | Local small Peeling at the interface between a transparent conductive layer and a sealing resin layer | 2 | Local small Peeling at the interface between a transparent conductive layer and a sealing resin layer |
| Comparative Example 4 | 14 | 41 | ○ | 2 | Local small Peeling at the interface between a transparent conductive layer and a sealing resin layer |
| Comparative Example 5 | 40 | 54 | ○ | 7 | Local small Peeling at the interface between a transparent conductive layer and a sealing resin layer |

As can be seen from Table 1, the solar cell module manufactured in accordance with the method of the present invention naturally had superior adhesion between the transparent conductive layer and the sealing resin layer immediately after the sealing was performed. In addition, occurrence of peeling of the sealing resin layer was not observed at all even after the high temperature and high humidity test and the weather resistance test were performed, and the decrease in adhesion between the transparent conductive layer and the sealing resin layer could be significantly suppressed as compared to that of the sample which was not irradiated with UV rays. Furthermore, the decrease in adhesion between the collector electrode and the transparent conductive layer was simultaneously suppressed when the decrease in adhesion with the sealing resin layer was suppressed. As a result, as shown in Table 1, in the high temperature and high humidity test, the retention of adhesion between the collector electrode and the transparent conductive layer was high, and hence it was understood that a superior solar cell module can be obtained.

On the other hand, according to the results obtained in comparative examples 1 to 4 in which UV radiation was not performed, the decrease in adhesion between the transparent conductive layer and the sealing resin layer was significant, and small peeling was observed in some cases. When peeling occurs, water may stay at the peeled portion by dew formation or the like and may cause corrosion of the element, and as a result, the reliability of the solar cell module is significantly degraded in some cases. Hence, the occurrence of peeling must be prevented. In addition, according to the result obtained in comparative example 5, it was also understood that, although UV radiation is performed, when the contact angle is more than 60°, a sufficient effect cannot be obtained.

In addition, the manufacturing method of a solar cell module, according to the present invention, is not particularly limited to the examples described above and may be variously changed without departing from the sprit and the scope of the present invention.

As has thus been described, according to the present invention, the method for manufacturing a solar cell module which comprises photovoltaic elements in each of which a metal oxide layer forms an outermost surface part of the photovoltaic element at a light incident side, and a sealing resin layer on the metal oxide layers, comprises a step of providing water on surface of the metal oxide layers, the water being chemically adsorbed thereto; a step of irradiating the metal oxide layers with electromagnetic waves for a predetermined time so that the contact angle of the water is 60° or less, the electromagnetic waves having energy larger than the band gap of the metal oxide; and a sealing step of subsequently forming the sealing resin layer on the metal oxide layers. Hence, the adhesion between the transparent conductive layer provided on the surface of the photovoltaic element and the sealing resin layer which is in direct contact with the transparent conductive layers can be improved, and as a result, a manufacturing method of a solar cell module can be provided which is able to minimize occurrence of peeling between the sealing resin layer and the transparent conductive layers even when the solar cell module is used outside under severe conditions for a long period of time.

Furthermore, a solar cell module can be manufactured which can improve the adhesion between the collector electrodes and the transparent conductive layer, which can suppress the increase in contact resistance therebetween primarily caused by the change in temperature, and which can exhibit stable performances even when used outside for a long period of time.

While the present invention has been described with reference to what are presently considered to be the preferred embodiments, it is to be understood that the invention is not limited to the disclosed embodiments. On the contrary, the invention is intended to cover various modifications and equivalent arrangements included within the spirit and scope of the appended claims. The scope of the following claims is to be accorded the broadest interpretation so as to encompass all such modifications and equivalent structures and functions.

What is claimed is:

1. A method for manufacturing a solar cell module which comprises at least one photovoltaic element in which a metal oxide layer made of a metal oxide forms an outermost surface part of the photovoltaic element at a light incident side, and a sealing resin layer formed on the metal oxide layer, the method comprising:
   a step of providing water on a surface of the metal oxide layer, the water being chemically adsorbed onto the surface of the metal oxide layer;
   a step of irradiating the metal oxide layer with electromagnetic waves for a predetermined period of time so that the contact angle of the water is 60° or less, the electromagnetic waves having energy larger than the band gap of the metal oxide; and
   a sealing step of forming the sealing resin layer on the metal oxide layer subsequent to the step of irradiating the metal oxide layer.

2. The method for manufacturing a solar cell module, according to claim 1, further comprising:
   a step of washing the surface of the metal oxide layer with water before the sealing step is performed.

3. The method for manufacturing a solar cell module, according to claim 1, further comprising:
   a step of performing heat treatment for a predetermined time in a vacuum atmosphere before the sealing step is performed.

4. The method for manufacturing a solar cell module, according to claim 1, wherein the radiation intensity of the electromagnetic waves is in the range of 10 to 1,000 $mW/cm^2$.

5. The method for manufacturing a solar cell module, according to claim 1, wherein the wavelength of the electromagnetic waves is 400 nm or less.

6. The method for manufacturing a solar cell module, according to claim 1, wherein the electromagnetic waves are radiated using a discharge tube lamp.

7. The method for manufacturing a solar cell module, according to claim 1, wherein the sealing resin layer contains one or more materials selected from the group consisting of cross-linking agents, thermal-oxidation inhibitors, ultraviolet absorbers, and photo-oxidation inhibitors.

8. The method for manufacturing a solar cell module, according to claim 7, wherein the sealing resin layer contains an ultraviolet absorber.

* * * * *